United States Patent [19]
Kao et al.

[11] Patent Number: 5,933,738
[45] Date of Patent: *Aug. 3, 1999

[54] METHOD OF FORMING A FIELD EFFECT TRANSISTOR

[75] Inventors: David Kao, Meridian; Yauh-Ching Liu, Boise, both of Id.

[73] Assignee: Micron Technology, Inc., Boise, Id.

[*] Notice: This patent is subject to a terminal disclaimer.

[21] Appl. No.: 08/964,779

[22] Filed: Nov. 5, 1997

Related U.S. Application Data

[63] Continuation of application No. 08/552,855, Nov. 3, 1995, Pat. No. 5,688,700.

[51] Int. Cl.⁶ .................................................. H01L 21/339
[52] U.S. Cl. ............................................ 438/291; 438/305
[58] Field of Search ..................................... 438/291, 305, 438/300, 301, 303, 306

[56] References Cited

U.S. PATENT DOCUMENTS

| 3,853,633 | 12/1974 | Armstrong | 437/29 |
| 4,471,522 | 9/1984 | Jambotkar | 29/571 |
| 4,939,100 | 7/1990 | Jeuch | 437/44 |
| 5,073,512 | 12/1991 | Yoshino | 437/45 |
| 5,175,119 | 12/1992 | Matsutani | 437/44 |
| 5,270,234 | 12/1993 | Huang et al. | 437/44 |
| 5,472,897 | 12/1995 | Hsu et al. | 437/44 |
| 5,597,752 | 1/1997 | Niwa | 437/44 |
| 5,688,700 | 11/1997 | Kao et al. | 437/29 |

OTHER PUBLICATIONS

Tsukamoto, H., et al., "Sub 0.1μm nMOSFET Utilizing Narrow Trench Gate and Selective Excimer Laser Annealing (SELA)," SSDM 1993, pp. 26–28.

J. Chung et al., "Deep–Submicrometer MOS Device Fabrication Using a Photoresist–Ashing Technique," IEEE Electron Device Letters, vol. 9, No. 4, Apr. 1988, pp. 186–188.

Shinichiro Kimura et al., "A 0.1μm–gate Elevated Source and Drain MOSFET Fabricated by Phase–Shifted Lithography," IEDM 91, pp. 13.8.1–13.8.3.

*Primary Examiner*—Brian Dutton
*Attorney, Agent, or Firm*—Wells, St. John, Roberts, Gregory & Matkin, P.S.

[57] ABSTRACT

A semiconductor processing method of forming a field effect transistor includes, a) providing a first layer of material over a substrate; b) providing a first opening through the first layer, the first opening having a width and a base; c) providing a second layer of material over the first layer and to within the first opening to a thickness which is less than one half the first opening width to less than completely fill the first opening and define a narrower second opening; d) anisotropically etching the second layer of material from outwardly of the first layer and from the first opening base to effectively provide inner sidewall spacers within the first opening; e) providing a gate dielectric layer within the second opening; f) providing a layer of electrically conductive gate material over the first layer and to within the second opening over the gate dielectric layer to fill the second opening with conductive gate material; g) without masking, planarize etching the conductive gate material layer substantially selective relative to the first layer to define a transistor gate within the second opening; and h) providing opposing source and drain regions relative to the transistor gate.

8 Claims, 6 Drawing Sheets

_Fig. 13_

_Fig. 14_

METHOD OF FORMING A FIELD EFFECT TRANSISTOR

RELATED PATENT DATA

This patent resulted from a continuation application of U.S. patent application Ser. No. 08/552,855, filed Nov. 3, 1995, entitled "Method of Forming a Field Effect Transistor", naming David Kao and Yauh-Ching Liu as inventors, and which is now U.S. Pat. No. 5,688,700.

TECHNICAL FIELD

This invention relates to semiconductor processing methods of forming field-effect transistors.

BACKGROUND OF THE INVENTION

Photolithography is a common process used in semiconductor wafer fabrication. In photolithography, positive or negative photoresist is utilized to provide desired islands or holes relative to material on a substrate.

One common electronic device which is fabricated using photolithography is a field effect transistor. Field effect transistors are comprised of a pair of electrically conductive diffusion regions, referred to as a source and a drain, spaced apart within a semiconductive substrate. Such transistors include a conductive gate provided adjacent the separation region between the diffusion regions for imparting an electric field to enable current to flow between the diffusion regions. The substrate area adjacent the gate and between the diffusion regions is referred to as the channel. The semiconductive substrate typically comprises a bulk monocrystalline silicon substrate having a light conductivity dopant impurity concentration. Alternately, the substrate can be provided in the form of a thin layer of lightly doped semiconductive material over an underlying insulating layer. Such are commonly referred to as semiconductor-on-insulator (SOI) constructions.

Integrated circuitry fabrication technology continues to strive to increase circuit density, and thereby minimize the size and channel lengths of field effect transistors. Improvements, in technology have resulted in reduction of field effect transistor size from long-channel devices (i.e., channel lengths greater than 2 microns) to short-channel devices (i.e., channel lengths less than 2 microns).

Photolithography is typically utilized to fabricate desired gate lines for transistors. As channel lengths (gate widths) continue to shrink, it would be desirable to produce or conceive of ways to shorten channel lengths to dimensions below the minimum currently available photo lithographic feature size. Such constitutes the principal motivation resulting in this invention. However, the artisan will appreciate utility of aspects of the invention in other than merely breaking through minimum photolithography limits, with the invention only being limited by the accompanying claims appropriately interpreted in accordance with the doctrine of equivalents.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a field effect transistor comprises the following steps:

providing a first layer of material over a substrate;

providing a first opening through the first layer, the first opening having a width and a base;

providing a second layer of material over the first layer and to within the first opening to a thickness which is less than one half the first opening width to less than completely fill the first opening and define a narrower second opening;

anisotropically etching the second layer of material from outwardly of the first layer and from the first opening base to effectively provide inner sidewall spacers within the first opening;

providing a gate dielectric layer within the second opening;

providing a layer of electrically conductive gate material over the first layer and to within the second opening over the gate dielectric layer to fill the second opening with conductive gate material;

without masking, planarize etching the conductive gate material layer substantially selective relative to the first layer to define a transistor gate within the second opening; and providing opposing source and drain regions relative to the transistor gate.

In accordance with another aspect, a semiconductor processing method of forming a field effect transistor comprises the following steps:

providing an active area region and an adjacent field isolation region relative to a substrate;

conducting a blanket LDD implant into the active area region;

after the blanket LDD implant, providing a first layer of material over the active area region and the field isolation region;

providing a first opening through the first layer, the first opening having a width and a base;

providing a second layer of material over the first layer and to within the first opening to a thickness which is less than one half the first opening width to less than completely fill the first opening and define a narrower second opening;

anisotropically etching the second layer of material from outwardly of the first layer and from the first opening base to effectively provide inner sidewall spacers within the first opening;

after anisotropically etching, conducting a $V_t$ implant into the active area region through the second opening using the first layer and sidewall spacers as a mask to such $V_t$ implanting, the $V_t$ implanting being conducted to a dopant concentration which is greater than the previous LDD implant concentration;

providing a gate dielectric layer within the second opening;

after the $V_t$ implanting, providing a layer of electrically conductive gate material over the first layer and to within the second opening over the gate dielectric layer to fill the second opening with conductive gate material;

removing a portion of the conductive gate material layer to define a transistor gate within the second opening; and providing opposing source and drain regions relative to the transistor gate.

In accordance with still a further aspect, a semiconductor processing method of forming a field effect transistor comprises the following steps:

providing a sacrificial pad oxide layer and a nitride masking layer over a substrate;

patterning the nitride masking layer for definition of active area regions and adjacent field oxide regions;

subjecting the substrate to conditions effective to oxidize areas of the substrate not covered by the nitride layer to field oxide;

after the oxidizing, stripping the nitride masking layer selectively relative to the pad oxide layer;

providing an etch stop layer over the pad oxide layer;

providing a first layer of material over the pad oxide layer;

providing a first opening through the first layer to the etch stop layer, the first opening having a width and a base;

providing a second layer of material over the first layer and to within the first opening to a thickness which is less than one half the first opening width to less than completely fill the first opening and define a narrower second opening;

anisotropically etching the second layer of material from outwardly of the first layer and from the first opening base selectively relative to the pad oxide layer to effectively provide inner sidewall spacers within the first opening;

stripping the pad oxide layer from within the second contact opening;

after stripping the pad oxide layer, providing a gate dielectric layer within the second opening;

providing a layer of electrically conductive gate material over the first layer and to within the second opening over the gate dielectric layer to fill the second opening with conductive gate material;

without masking, planarize etching the conductive gate material layer substantially selective relative to the first layer to define a transistor gate within the second opening; and providing opposing source and drain regions relative to the transistor gate.

Figure 1:
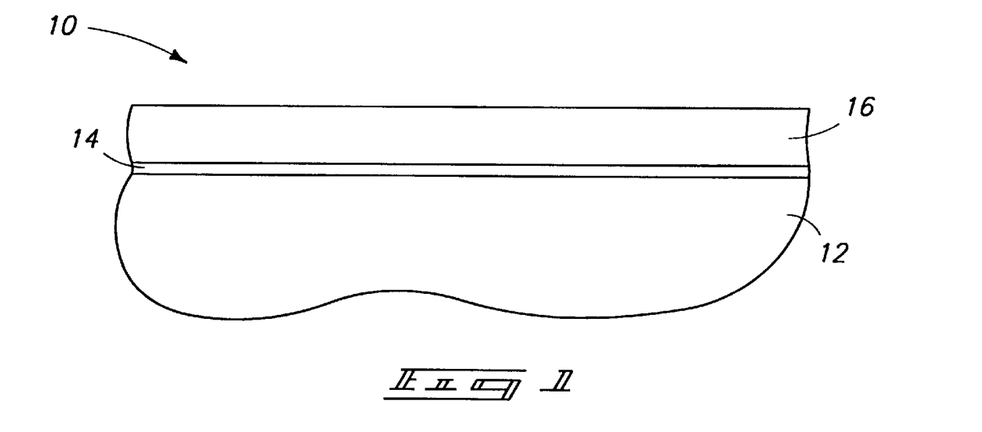
FIG. 1 is a diagrammatic sectional view of a semiconductor wafer fragment at one processing step in accordance with the invention.

More particularly a wafer fragment in a semiconductor processing method of forming a field-effect transistor is indicated generally by reference numeral 10 in FIG. 1. Such is comprised of a bulk monocrystalline silicon substrate 12 having a sacrificial pad oxide layer 14 and a nitride masking layer 16 provided thereatop. An example preferred thickness for layer 14 is from 50 to 500 Angstroms, with an example preferred thickness for layer 16 being from 600 to 5000 Angstroms. Layer 16 preferably comprises $Si_3N_4$, while layer 14 preferably comprises $SiO_2$.

Figure 2:
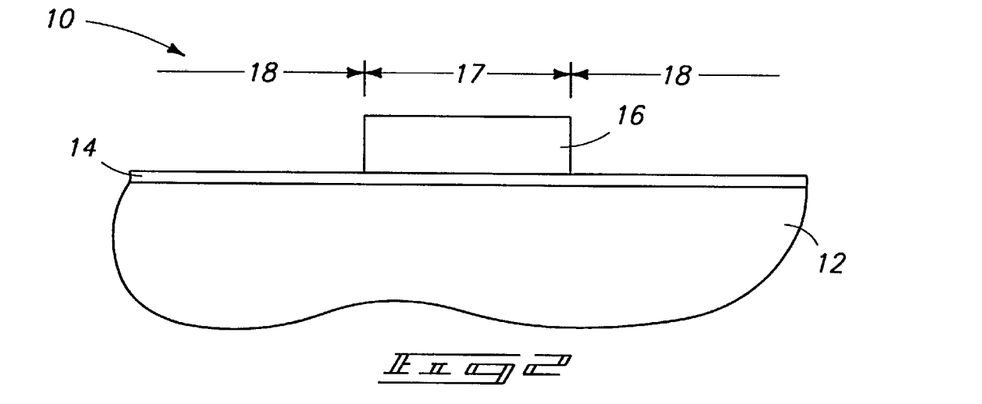
FIG. 2 is a view of the FIG. 1 wafer fragment at a processing step subsequent to that shown by FIG. 1.

Referring to FIG. 2, nitride masking layer 16 is patterned for definition of what will be active area region 17 and adjacent field oxide regions 18.

Figure 3:
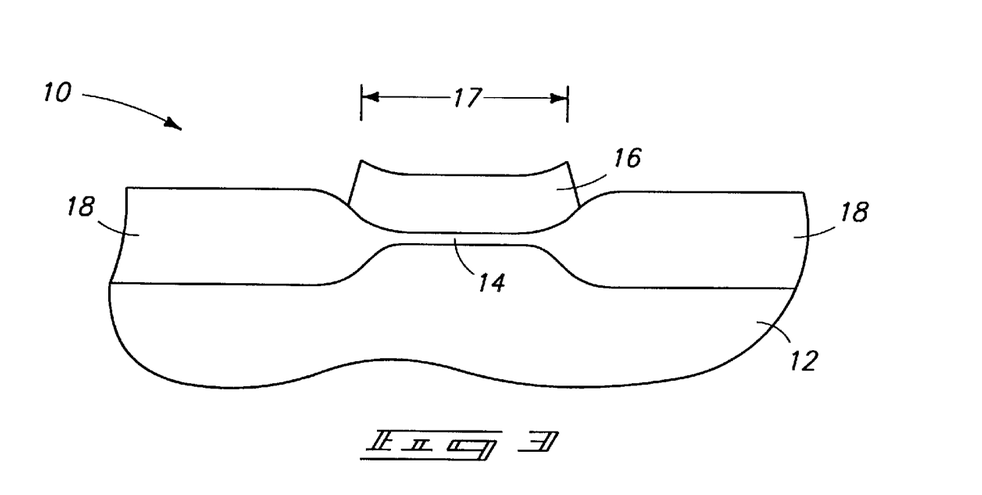
FIG. 3 is a view of the FIG. 1 wafer fragment at a processing step subsequent to that shown by FIG. 2.

Referring to FIG. 3, the subject wafer fragment or substrate is subjected to oxidizing conditions effective to oxidize those areas of the substrate not covered by nitride layer 16, thus forming the illustrated field oxide regions 18. Example oxidizing conditions include 950° C. for 2.5 hours in an $O_2$ and $H_2$ ambient, to grow 3500 Angstroms of oxide. Thus, an active area region 17 and adjacent field isolation regions 18 are provided relative to a substrate.

Figure 4:
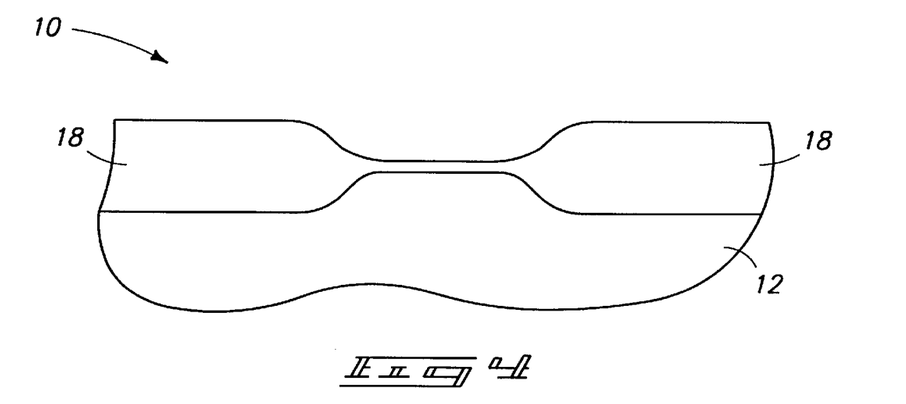
FIG. 4 is a view of the FIG. 1 wafer fragment at a processing step subsequent to that shown by FIG. 3.

Referring to FIG. 4 and after such oxidizing, nitride masking layer 16 is stripped from the substrate selectively relative to pad oxide layer 14.

Figure 5:
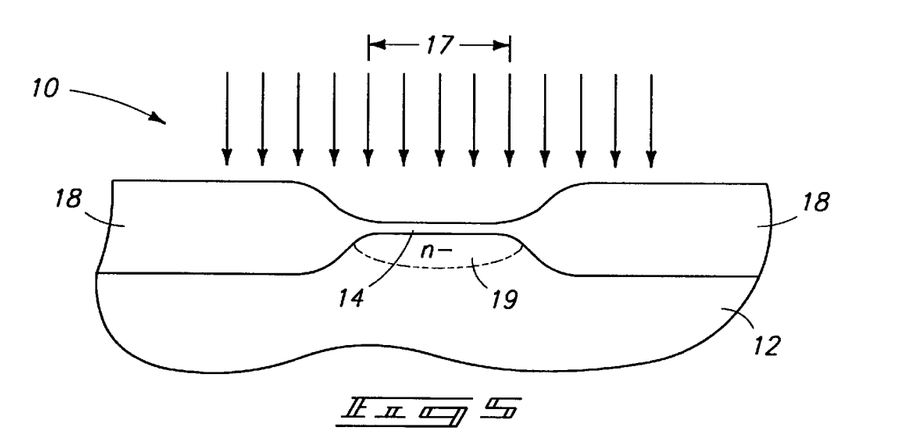
FIG. 5 is a view of the FIG. 1 wafer fragment at a processing step subsequent to that shown by FIG. 4.

Referring to FIG. 5, a blanket LDD implant is conducted into active area region 17, preferably without masking, with field oxide regions 18 effectively preventing implanting of such material into substrate area therebeneath. If forming NMOS devices, such implant material will be n–, such as arsenic or phosphorus deposited to an example dopant concentration of $5 \times 10^{17}$ to $1 \times 10^{18}$ ions/cm$^3$, to provide blanket LDD region 19.

Figure 6:
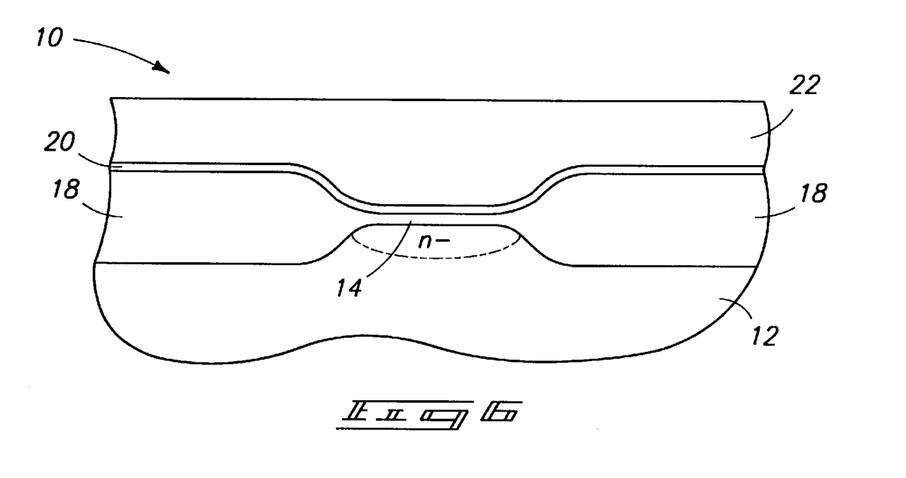
FIG. 6 is a view of the FIG. 1 wafer fragment at a processing step subsequent to that shown by FIG. 5.

Referring to FIG. 6, a $Si_3N_4$ etch stop layer 20 is provided over pad oxide layer 14. An example preferred thickness for layer 20 is from 50 Angstroms to 300 Angstroms. LDD implanting might be provided either before or after provision of such layer 20. Subsequently, a first layer 22, preferably undoped $SiO_2$ or BPSG, is provided over pad oxide layer 14 and nitride etch stop layer 20, and thus over active area region 17 and field isolation regions 18 of substrate 10. The first layer is preferably planarized, as shown.

Figure 7:
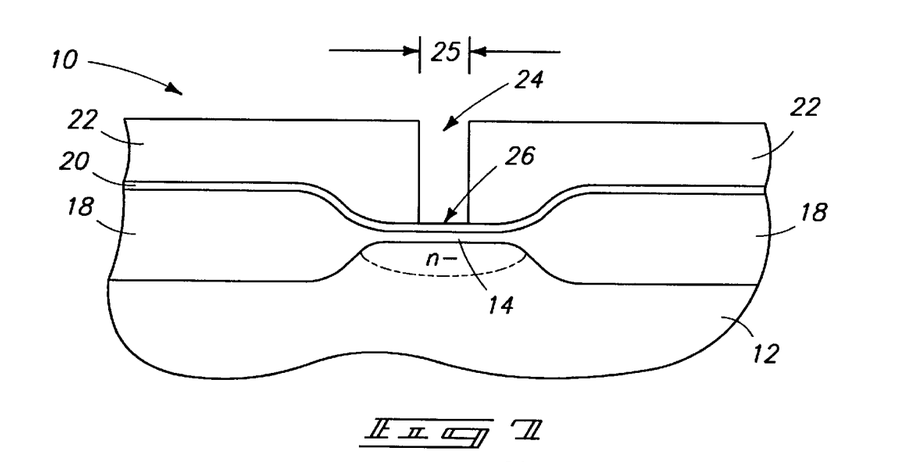
FIG. 7 is a view of the FIG. 1 wafer fragment at a processing step subsequent to that shown by FIG. 6.

Referring to FIG. 7, a first opening 24 is provided through first layer 22 to etch stop layer 20. First opening 24 has a width 25 and a base 26. In accordance with the most preferred aspect of the invention, first opening 24 is patterned in the form of an elongated trough for forming a conductive gate line, with width 25 being the minimum available photolithographic feature size or limit.

Figure 8:
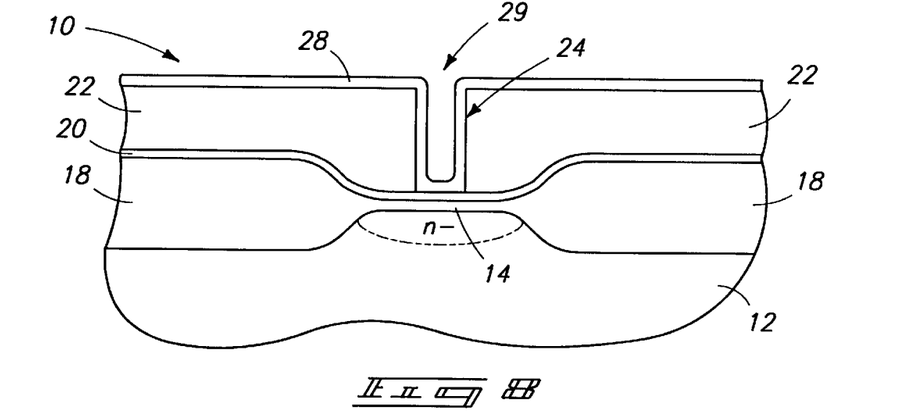
FIG. 8 is a view of the FIG. 1 wafer fragment at a processing step subsequent to that shown by FIG. 7.

Referring to FIG. 8, a second layer of material 28 is provided over first layer 22 and to within first opening 24 to a thickness which is less than one-half first opening width 25 to less than completely fill first opening 24, and define a narrower second opening 29. Thus, second opening 29 is provided to be narrower than the minimum available photolithographic feature size. Preferably, the material of first layer 22 and the material of second layer 28 comprise different materials which are selectively etchable relative to one another. An example preferred second layer material, where the first layer material comprises oxide, is $Si_3N_4$.

Figure 9:
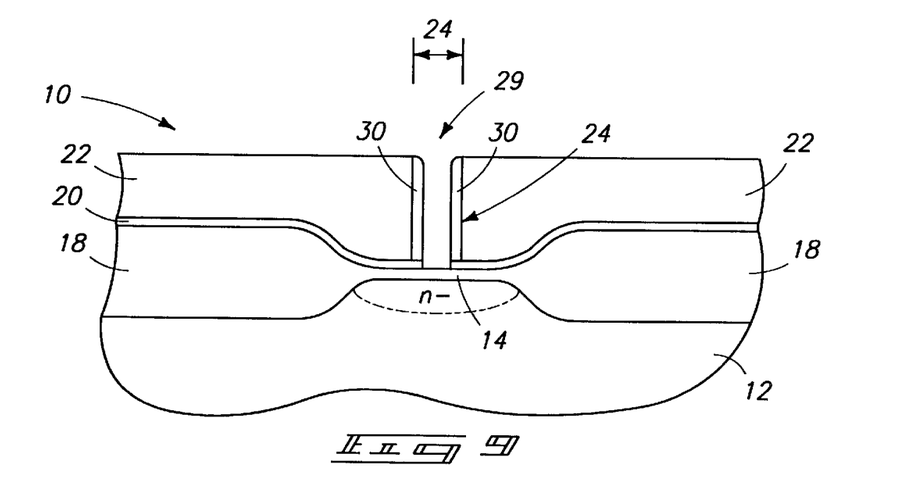
FIG. 9 is a view of the FIG. 1 wafer fragment at a processing step subsequent to that shown by FIG. 8.

Referring to FIG. 9, second layer 28 is anisotropically etched from outwardly of first layer 22 and from first opening base 26 to effectively provide inner sidewall spacers 30 within first opening 24. Preferably and as shown, such etching is conducted to etch nitride etch stop layer 20 from within first opening 24, and selectively relative to pad oxide layer 14. Example etching conditions for such an etch include plasma etching in a $CF_4$ ambient for from 16 seconds to 1 minute. Thus, an advantage is provided in forming second layer 28 and etch stop layer 20 of the same material, enabling removal of etch stop material 20 from within the contact opening during a single anisotropic etching step.

Figure 10:
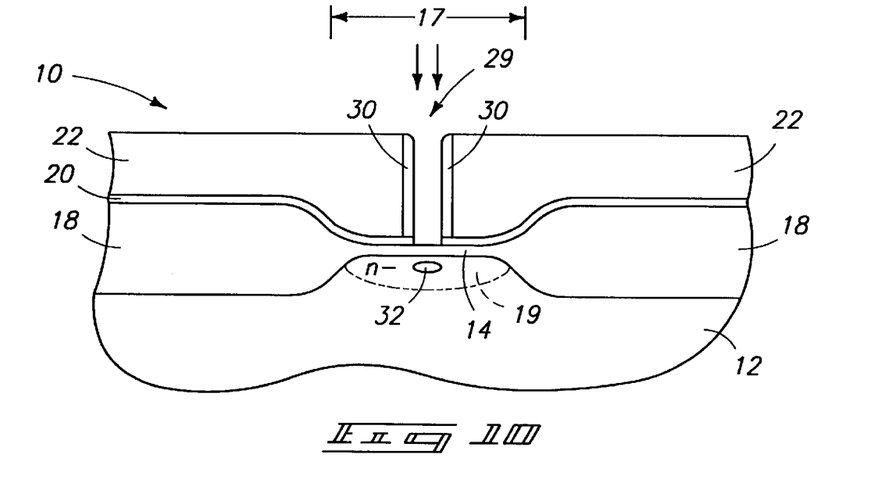
FIG. 10 is a view of the FIG. 1 wafer fragment at a processing step subsequent to that shown by FIG. 9.

Referring to FIG. 10, a $V_t$ implant is conducted into active area region 17 through second opening 29 using first layer 22 and sidewall spacers 30 as a mask to such $V_t$ implanting, thus providing $V_t$ implant region 32. The $V_t$ implanting typically comprises the opposite type material of the particular MOS type (NMOS or PMOS), and is conducted in this preferred example to a dopant concentration which is greater than the previous LDD implant concentration. An example implant concentration for region 32 is from $2 \times 10^{17}$ to $5 \times 10^{17}$ ions/cm$^3$. Where NMOS transistors are being provided, such implant will comprise a p-type material such as boron or $BF_2$.

Figure 11:
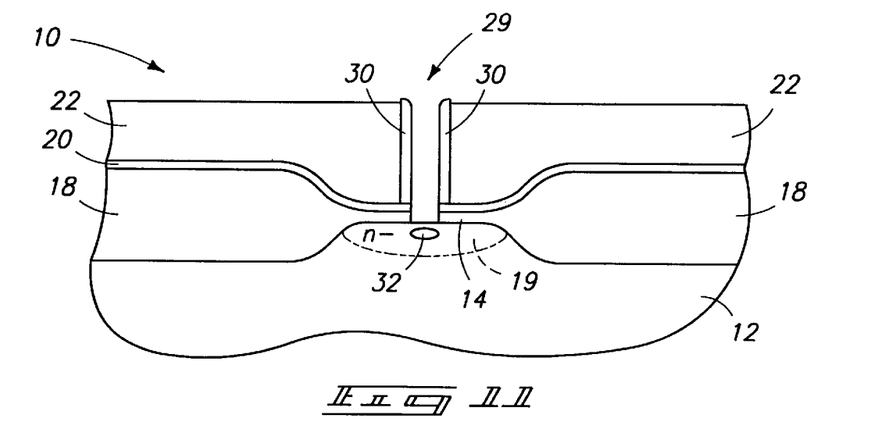
FIG. 11 is a view of the FIG. 1 wafer fragment at a processing step subsequent to that shown by FIG. 10.

Referring to FIG. 11, pad oxide layer material 14 in second opening 29 is stripped from therewithin. Such also strips some of the oxide material of layer 22. Implant region 32 can be provided either before or after the pad oxide strip.

Figure 12:
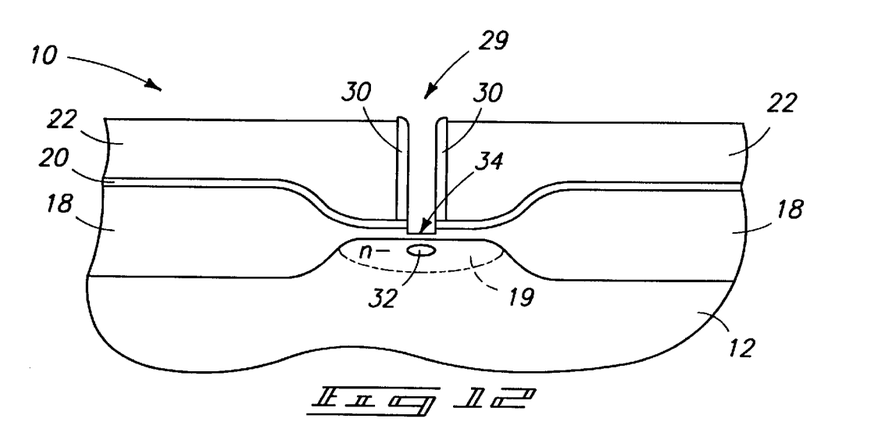
FIG. 12 is a view of the FIG. 1 wafer fragment at a processing step subsequent to that shown by FIG. 11.

Referring to FIG. 12, a gate dielectric layer, typically and preferably $SiO_2$, layer 34 is provided within second opening 29.

Figure 13:
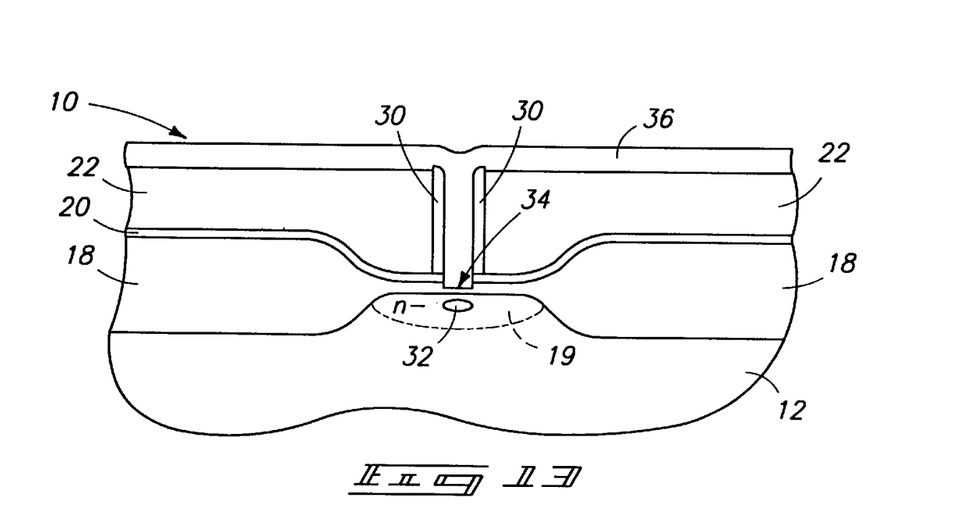
FIG. 13 is a view of the FIG. 1 wafer fragment at a processing step subsequent to that shown by FIG. 12.

Referring to FIG. 13, a layer 36 of electrically conductive gate material is provided over first layer 22 and to within second opening 29 over gate dielectric layer 34 to fill second opening 29 with conductive gate material. An example preferred material for layer 36 is conductively doped polysilicon. Layer 36 also might comprise a composite of more than one conductive layer, such as a sandwich of conductively doped polysilicon and a metal silicide.

Figure 14:
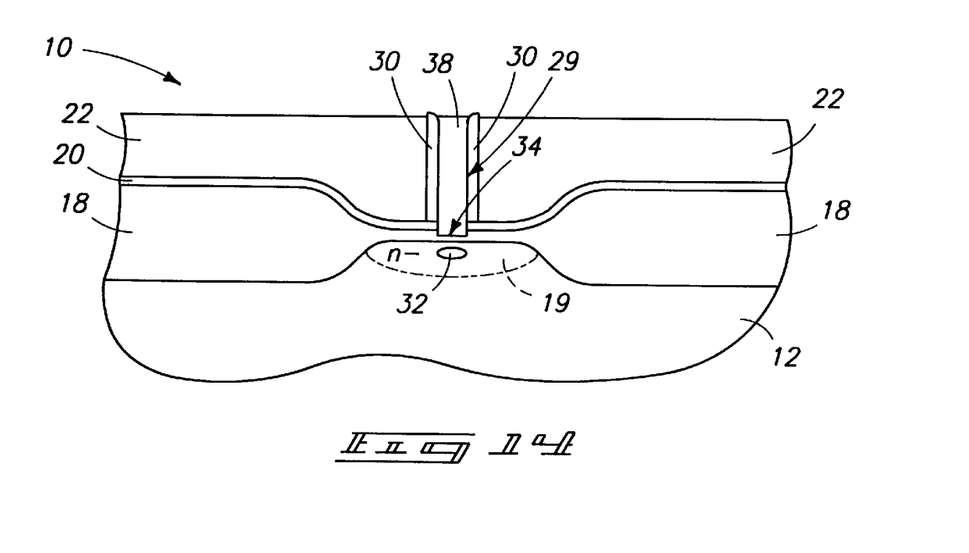
FIG. 14 is a view of the FIG. 1 wafer fragment at a processing step subsequent to that shown by FIG. 13

Referring to FIG. 14, a portion of conductive gate material layer 36 is removed to define a transistor gate 38 within second opening 29. Preferably, such removing is conducted without any separate dedicated masking and comprises a planarize etching step, with an example being chemical-mechanical polishing or chemical etching without mechanical polishing.

Figure 15:
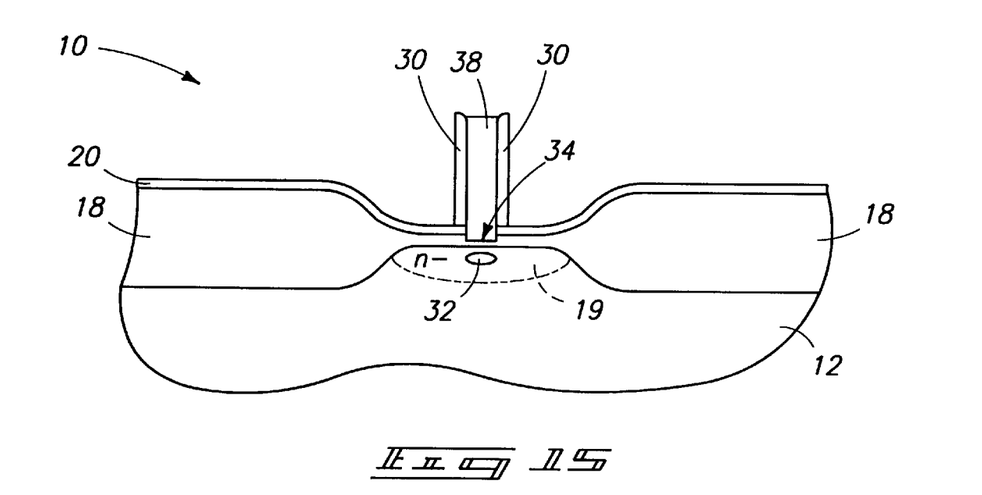
FIG. 15 is a view of the FIG. 1 wafer fragment at a processing step subsequent to that shown by FIG. 14.

Referring to FIG. 15, remnants of first layer 22 are stripped from the wafer, such as using a wet etch which is selective relative to the underlying etch stop nitride layer 20.

Figure 16:
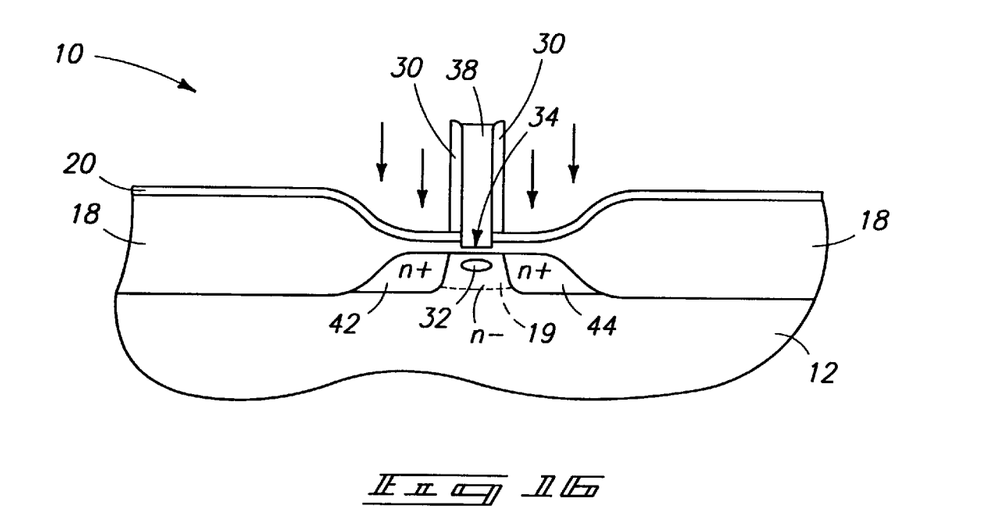
FIG. 16 is a view of the FIG. 1 wafer fragment at a processing step subsequent to that shown by FIG. 15.

Referring to FIG. 16, opposing source and drain regions 42 and 44 are provided relative to transistor gate 38, and overwhelmingly in concentration to LDD region 19. Such region 19, however, remains laterally inward relative to regions 44, thus providing an LDD function. Nitride spacers 30 might remain or be stripped relative to gate 38. Preferably the second material layer from which spacers 30 are formed will comprise an acceptable electrically insulative material enabling such spacers to remain to provide electrical isolation relative to sidewalls of gate 38.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming a field effect transistor comprising:

forming a first layer over a substrate having an area defining a channel region;

forming a first opening through the first layer and over the channel region;

after forming the first opening, forming a second layer within the first opening to define a second opening, said second layer being the only layer formed within the first opening to define the second opening;

forming sidewall spacers from the second layer by etching material of the second layer with said step of etching also outwardly exposing the channel region by removing portions of a previously-formed etch stop layer;

forming a layer of an electrically conductive gate material within the second opening; and while the sidewall spacers are adjacent the conductive gate material, forming opposing source and drain regions adjacent the channel region.

2. The semiconductor processing method of forming a field effect transistor of claim 1 wherein the first layer and the second layer comprise different materials.

3. The semiconductor processing method of forming a field effect transistor of claim 1 wherein the first layer comprises oxide.

4. The semiconductor processing method of forming a field effect transistor of claim 1 further comprising planarizing the layer of conductive gate material to define a transistor gate within the second opening by chemical-mechanical polishing said material.

5. The semiconductor processing method of forming a field effect transistor of claim 1 further comprising planarizing the layer of conductive gate material to define a transistor gate within the second opening by chemical etching without mechanical polishing.

6. A method of forming a transistor gate, comprising:

forming a trench in a first layer, the trench defining a field effect transistor gate line shape disposed over a transistor channel region;

forming a single sidewall spacer layer within the trench;

conducting a single anisotropic etch of the single sidewall spacer layer effective to form sidewall spacers within the trench and to expose the channel region by removing a previously-formed etch stop layer disposed over the channel region;

forming a layer of electrically conductive material within the trench and comprising a transistor gate; and forming source and drain regions adjacent the transistor gate.

7. A method of forming a transistor gate, comprising:

forming an opening in a first layer over a transistor channel region;

forming a sidewall spacer layer within the opening;

etching the sidewall spacer layer in an etch which forms sidewall spacers and exposes the channel region through an overlying etch stop layer;

forming a layer of electrically conductive material adjacent the sidewall spacers to provide a transistor gate; and forming source and drain regions adjacent the transistor gate.

8. A semiconductor processing method of forming a field effect transistor comprising:

forming a first layer over a substrate;

forming a first opening through the first layer;

forming a single second layer within the first opening to define a second opening;

anisotropically etching the single second layer effective to form sidewall spacers and to remove portions of a previously-formed etch stop layer;

forming a layer of an electrically conductive gate material within the second opening;

planarizing the layer of conductive gate material to define a transistor gate within the second opening; and forming opposing source and drain regions adjacent the transistor gate.

* * * * *